(12) United States Patent
Proulx et al.

(10) Patent No.: US 12,249,387 B2
(45) Date of Patent: Mar. 11, 2025

(54) MULTI-ZONE TEMPERATURE TESTING SYSTEM

(71) Applicant: Dell Products L.P., Round Rock, TX (US)

(72) Inventors: Robert Proulx, Holden, MA (US); Michael Rijo, San Jose, CA (US); Samuel Hudson, Foxborough, MA (US)

(73) Assignee: Dell Products L.P., Round Rock, TX (US)

( * ) Notice: Subject to any disclaimer, the term of this patent is extended or adjusted under 35 U.S.C. 154(b) by 253 days.

(21) Appl. No.: 17/897,576

(22) Filed: Aug. 29, 2022

(65) Prior Publication Data
US 2024/0071552 A1    Feb. 29, 2024

(51) Int. Cl.
*G11C 29/50* (2006.01)
(52) U.S. Cl.
CPC .......... *G11C 29/50004* (2013.01); *G11C 2029/5004* (2013.01)
(58) Field of Classification Search
CPC ...... G11C 29/50004; G11C 29/50; G11C 7/04
USPC ..................................................... 324/750.11
See application file for complete search history.

(56) References Cited

U.S. PATENT DOCUMENTS

2009/0153171 A1\* 6/2009 Lee .................. G01R 31/2874
324/750.09

\* cited by examiner

*Primary Examiner* — Alesa Allgood
*Assistant Examiner* — Courtney G McDonnough
(74) *Attorney, Agent, or Firm* — Joseph Mencher

(57) ABSTRACT

A multi-zone temperature testing system includes a test device having components, a multi-zone temperature testing device that is coupled to the test device and that includes a first thermoelectric module that is located adjacent a first subset of the components and a second thermoelectric module that is located adjacent a second subset of the components, and a temperature control subsystem that is coupled to the multi-zone temperature testing device. The temperature control subsystem controls the first thermoelectric module in the multi-zone temperature testing device to produce a first heat flux that provides a testing temperature for the first subset of the components, and controls the second thermoelectric module in the multi-zone temperature testing device to produce a second heat flux that is different than the first heat flux and that provides the testing temperature for the second subset of the components.

20 Claims, 11 Drawing Sheets

MULTI-ZONE TEMPERATURE TESTING SYSTEM

BACKGROUND

The present disclosure relates generally to information handling systems, and more particularly to temperature testing devices used in information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Components used in information handling systems such as, for example, storage devices, are often subject to temperature testing. For example, NAND storage subsystems used in Solid State Drive (SSD) storage devices may perform storage operations that are sensitive to temperature, and thus the testing of those NAND storage subsystems at different temperatures may be performed to ensure those storage operations satisfy storage operation thresholds. To provide a specific example, data written to a NAND storage subsystem at relatively high temperatures may be subject to errors when that data is later read at relatively lower temperatures, and thus temperature testing may be performed by providing NAND devices in the NAND storage subsystem at the relatively high temperature, writing data to those NAND devices, lowering the temperature of the NAND devices in the NAND storage subsystem, and reading that data back from the NAND devices to determine the error rate of the read data (as well as whether that error rate exceeds a threshold error rate). In another specific example, data stored in a NAND storage subsystem for relatively long periods of time may be subject to errors, and thus temperature testing may be performed by writing data to the NAND devices in the NAND storage subsystem, subjecting the NAND devices in the NAND storage subsystem to relatively high temperatures to simulate the aging of the data stored thereon, and then reading that data back from the NAND devices to determine the error rate of the read data (as well as whether that error rate exceeds a threshold error rate).

As will be appreciated by one of skill in the art in possession of the present disclosure, precise temperature control during temperature testing may be critical to testing the behavior of the NAND storage subsystems discussed above, and conventional temperature testing techniques have difficulties obtaining such precise temperature control while also being relatively expensive and time consuming to perform. For example, conventional temperature testing systems typically utilize relatively large and expensive temperature testing chambers to perform the temperature testing discussed above. Continuing with the specific example provided above, the NAND storage subsystem is provided in the temperature testing chamber, and the temperature of the temperature testing chamber is then be increased to the desired testing temperature for the NAND storage subsystem. However, temperature testing typically requires that each of the NAND devices on the NAND storage subsystem be provided and/or maintained at a uniform temperature, and such temperature testing chambers may experience difficulties in providing each of the NAND devices on the NAND storage subsystem at a uniform temperature. Furthermore, temperature testing chambers provide relatively low temperature change/ramp rates that can be detrimental when, for example, the temperature testing being conducted makes it desirable to prevent the NAND storage subsystem from being subject to a relatively high temperature for an extended period of time.

For example, the configuration of the circuit board in the NAND storage subsystem, the configuration of the NAND devices on the circuit board, and/or other factors may result in different NAND devices on the NAND storage subsystem experiencing different temperatures in a temperature testing chamber despite the temperature testing chamber being provided at a particular temperature. Furthermore, air circulation, condensation, and/or other environmental factors in the temperature testing chamber can present similar difficulties in providing NAND device temperature uniformity, and users often must manually configure cooling systems, drain plumbing, and/or other subsystems in the testing chamber in an attempt to remedy these issues. As such, conventional temperature testing systems can provide non-ideal temperature testing environments, are expensive, and often require downtime for temperature testing configuration and routine maintenance.

One option to the temperature testing chambers discussed above includes the use of small-scale, self-contained, temperature-controlled devices that are each configured to temperature test a single NAND device. However, temperature testing of relatively large sample sizes of NAND storage subsystems is desirable in order to capture variations that may occur die-to-die or lot-to-lot in the NAND storage subsystems, and it is cost-prohibitive to utilize small-scale, self-contained, temperature-controlled devices discussed above to test large samples of NAND storage subsystems.

Accordingly, it would be desirable to provide a temperature testing system that addresses the issues discussed above.

SUMMARY

According to one embodiment, a multi-zone temperature testing device includes a chassis; a first thermoelectric module that is included in the chassis and that is configured to: be located adjacent a first subset of a plurality of components on a test device when the chassis is coupled to the test device; and produce a first heat flux that provides a testing temperature for the first subset of the plurality of components; and a second thermoelectric module that is included in the chassis and that is configured to: be located adjacent a second subset of a plurality of components on the test device when the chassis is coupled to the test device; and produce a second heat flux that is different than the first heat flux and that provides the testing temperature for the second subset of the plurality of components.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
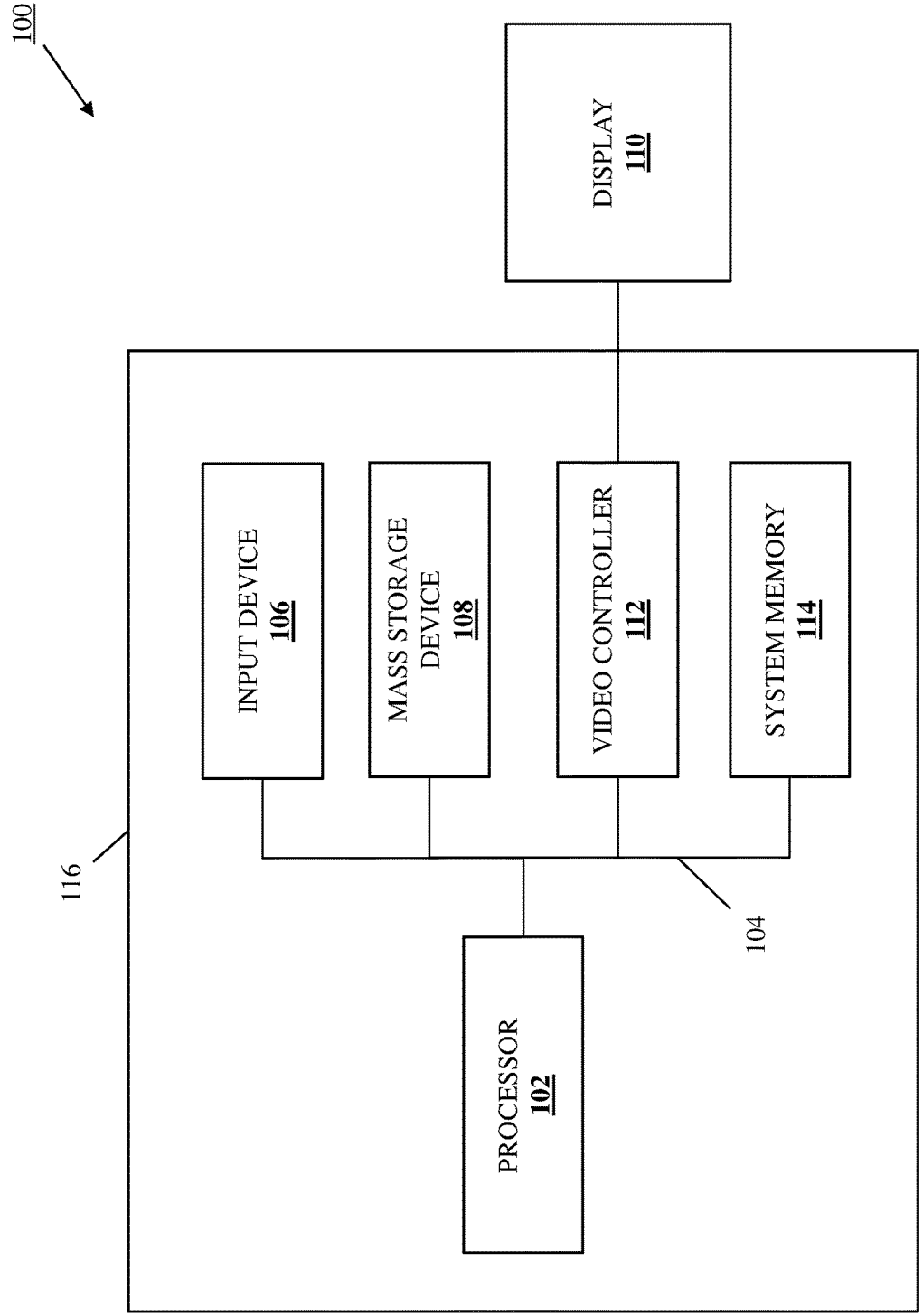
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
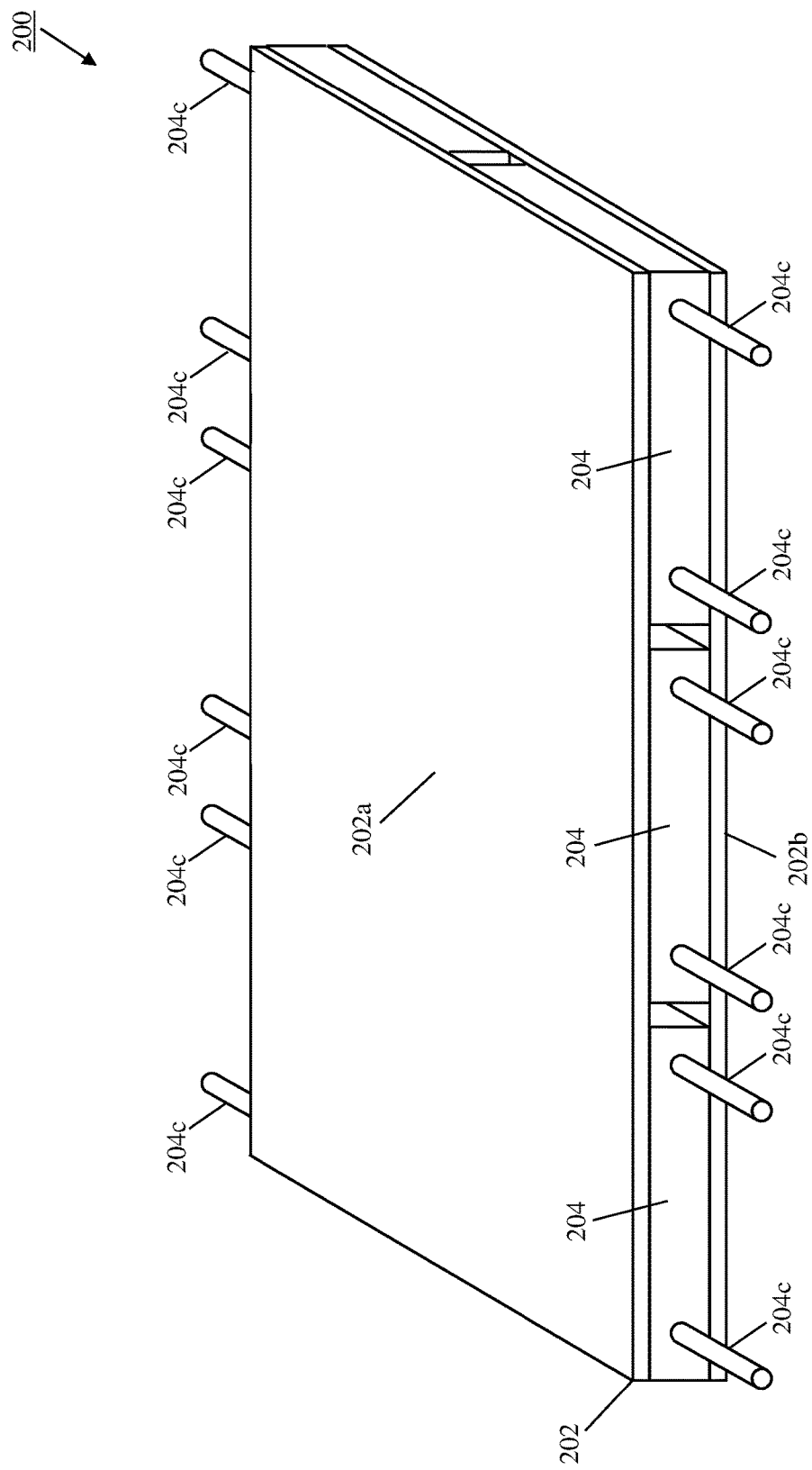
FIG. 2A is a schematic view illustrating an embodiment of multi-zone temperature testing device.
Figure 2B:
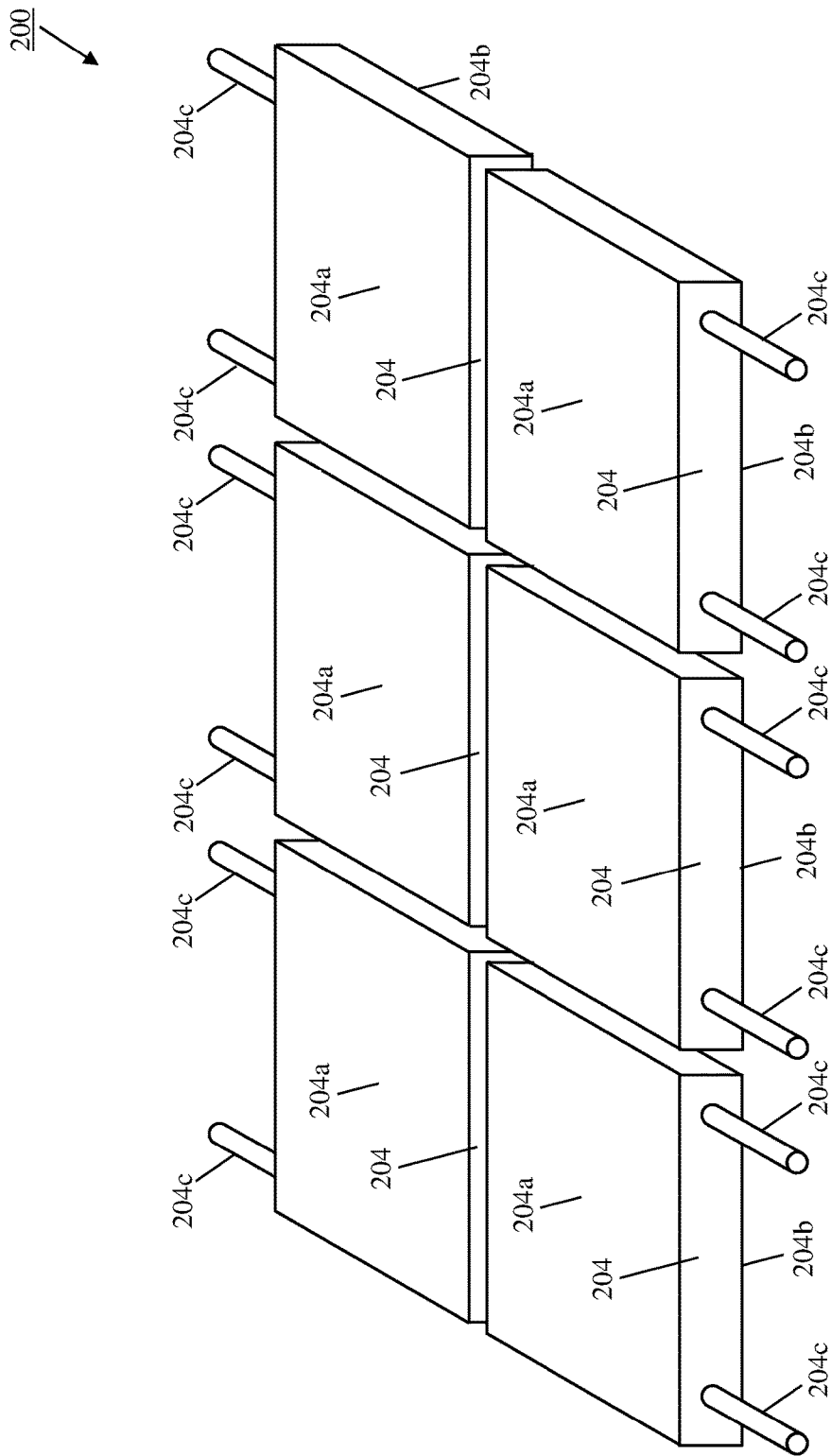
FIG. 2B is a schematic view illustrating an embodiment of the multi-zone temperature testing device of FIG. 2A.

Referring now to FIGS. 2A and 2B, an embodiment of a multi-zone temperature testing device 200 is illustrated that may be provided according to the teachings of the present disclosure. In the illustrated embodiment, the multi-zone temperature testing device 200 includes a chassis 202 having a top wall 202a and a bottom wall 202b that is located opposite the chassis 202 from the top wall 202a and spaced apart from the top wall 202a. In an embodiment, the top wall 202a and the bottom wall 202b of the chassis 202 may be provided by any of a variety of heat conductive materials that would be apparent to one of skill in the art in possession of the present disclosure. For example, the top wall 202a and the bottom wall 202b of the chassis 202 may be provided by heat conductive sheets that are configured to spread heat generated during the testing described below. Furthermore, as discussed below, while only the top wall 202a and the bottom wall 202b of the chassis 200 are illustrated in FIGS. 2A and 2B, the chassis 202 may include a variety of other components, elements, and/or features that one of skill in the art in possession of the present disclosure would recognize as providing any of the functionality described below.

A plurality of thermoelectric modules are coupled to the chassis 202 between the top wall 202a and the bottom wall 202b, with the specific examples illustrated and described herein including six thermoelectric modules 204 provided in a 2×3 configuration, as can be seen clearly in FIG. 2B that omits the top wall 202a and the bottom wall 202b of the chassis 202 for clarity with regard to the thermoelectric modules 204. As can be seen, each thermoelectric module 204 may include a first surface 204a, a second surface 204b that is located opposite that thermoelectric module 204 from the first surface 204a, and a pair of power couplings 204c that extends from that thermoelectric module 204 between the first surface 204a and the second surface 204b. As will be appreciated by one of skill in the art in possession of the present disclosure, each of the thermoelectric modules 204 may be configured to operate according to the Peltier effect to create a heat flux at the junction of two different types of materials in order to transfer heat between the first surface 204a and the second surface 204b in response to a current being generated in the thermoelectric module 204 via the power couplings 204c.

For example, each thermoelectric module 204 may include two different semiconductor materials (e.g., an n-type semiconductor and a p-type semiconductor with different electron densities) that may be configured in an alternating pillar arrangement, thermally parallel to each other and electrically in series between respective conducting plates (e.g., ceramic conducting plates) that provide the first surface 204a and the second surface 204b. As will be appreciated by one of skill in the art in possession of the present disclosure, when a voltage is applied to the power couplings 204c to produce a current across the junction of the semiconductor materials, a temperature difference will be generated due to, for example, a "first" side of the thermoelectric module 204 with the first surface 204a absorbing heat that is transferred by the semiconductor materials to a "second" side of the thermoelectric module 204 with the second surface 204b. As such, each thermoelectric module 204 may be powered to transmit heat across that thermoelectric module 204 between a "hot" surface (e.g., one of the first surface 204a and the second surface 204b) and a "cold" surface (e.g., the other of the first surface 204a and the second surface 204b).

As will be appreciated by one of skill in the art in possession of the present disclosure, the amount of heat that may be transmitted between the hot surface and the cold surface on the thermoelectric module 204 (i.e., the heat flux) will depend on the temperature difference between the hot surface and the cold surface on the thermoelectric module 204 and the current produced in the thermoelectric module 204. For example, if the hot surface and the cold surface of the thermoelectric module 204 are the same temperature, a relatively large heat flux may be generated by the thermoelectric module 204 when sufficient current is produced in the thermoelectric module 204. However, if the temperature difference of the hot surface and the cold surface of the thermoelectric module 204 is relatively high, a relatively small heat flux may be generated by the thermoelectric module 204 even when a maximum current is produced in the thermoelectric module 204. Furthermore, if a first voltage applied to the power couplings 204c on the thermoelectric module 204 produces a first heat flux in the thermoelectric module 204, a second voltage that is opposite/reversed relative to the first voltage will produce a second heat flux in an opposite direction in the thermoelectric module 204 relative to the first heat flux. However, while a specific example of the thermoelectric modules 204 has been described, one of skill in the art in possession of the present disclosure will appreciate that thermoelectric modules may be configured and/or may operate in different manners while remaining within the scope of the present disclosure as well.

In some embodiments, the multi-zone temperature testing device 200 may be an integrated testing device that may be provided by integrating the thermoelectric modules 204 with the chassis 202 in a set configuration. For example, the thermoelectric modules 204 may be epoxied in place to each other and/or the chassis 202 (e.g., between the heat conductive sheets that provide the top wall 202a and the bottom wall 202b of the chassis 202) in a desired configuration, and as discussed below the configuration of the thermoelectric modules 204 may be provided depending on the configuration of the components on the test devices that the multi-zone temperature testing device 200 will test. As such, while the specific example of the multi-zone temperature testing device 200 described herein includes a particular configuration, one of skill in the art in possession of the present disclosure will appreciate how different testing devices may be provided according to the teachings of the present disclosure in different configurations for each test device that has a corresponding configuration that will be tested.

To provide a specific example, in addition to the multi-zone temperature testing device 200 of FIGS. 2A and 2B that include thermoelectric modules 204 provided in the 2×3 configuration, a testing device may be provided with thermoelectric modules in a 1×3×2 configuration that corresponds to a test device configuration of a test device, discussed in further detail below. However, while the provisioning of different multi-zone temperature testing devices for particular test device configurations has been described, one of skill in the art in possession of the present disclosure will appreciate how a multi-zone temperature testing device may be provided according to the teachings of the present disclosure to provide a grid or matrix of thermoelectric modules with a sufficient "thermoelectric-module-granularity" (e.g., a 10×20 grid of relatively small thermoelectric modules) to test any of a variety of differently configured test devices similarly as discussed below (e.g., with any of the thermoelectric modules positioned adjacent components of interest on the test device activated to produce the heat fluxes discussed below, while any of the thermoelectric modules that are not positioned adjacent components of interest on the test device are not activated to produce the heat fluxes discussed below).

In other embodiments, the multi-zone temperature testing device 200 may be a modular testing device that may be provided by modular thermoelectric modules 204 that are configured to couple to each other and/or the chassis 202 in order to allow a user to provide the multi-zone temperature testing device 200 in different configurations based on any particular test device that will be tested. As such, one of skill in the art in possession of the present disclosure will appreciate how the thermoelectric modules 204 and/or the chassis 202 may include any of a variety of coupling features that would allow the connection and/or coupling of the thermoelectric modules 204 to each other and/or the chassis 202 in order to provide the multi-zone temperature testing device 200 in different configurations for any test devices that has a corresponding configuration that will be tested. To provide a specific example, the multi-zone temperature testing device 200 of FIGS. 2A and 2B that include thermoelectric modules 204 provided in the 2×3 configuration may be reconfigured to provide the thermoelectric modules 204 in a 1×3×2 configuration that corresponds to a test device configuration of a test device, discussed in further detail below.

As discussed below, the pairs of power couplings 204c on each of the thermoelectric modules 204 in the multi-zone temperature testing device 200 will be coupled to a temperature control subsystem that is configured to power the thermoelectric modules 204. As such, a variety of controller coupling techniques may be utilized to allow the temperature control subsystem to power the thermoelectric modules 204. For example, separate wiring/cabling may be provided between the power couplings 204c on each of the thermoelectric modules 204 in the multi-zone temperature testing device 200 and the temperature control subsystem. However, in other examples, the pairs of power couplings 204c on each of the thermoelectric modules 204 in the multi-zone temperature testing device 200 may be coupled to a single connector that is provided to allow the temperature control subsystem to couple to each of the power couplings 204c on each of the thermoelectric modules 204 in the multi-zone temperature testing device 200 via a single wire/cable/connector. As such, one of skill in the art in possession of the present disclosure will appreciate that, while not explicitly illustrated herein, the pairs of power couplings 204c on the thermoelectric modules 204 in the multi-zone temperature testing device 200 may be configured in a variety of manners to allow for the functionality of the thermoelectric modules 204 described below.

Figure 3:
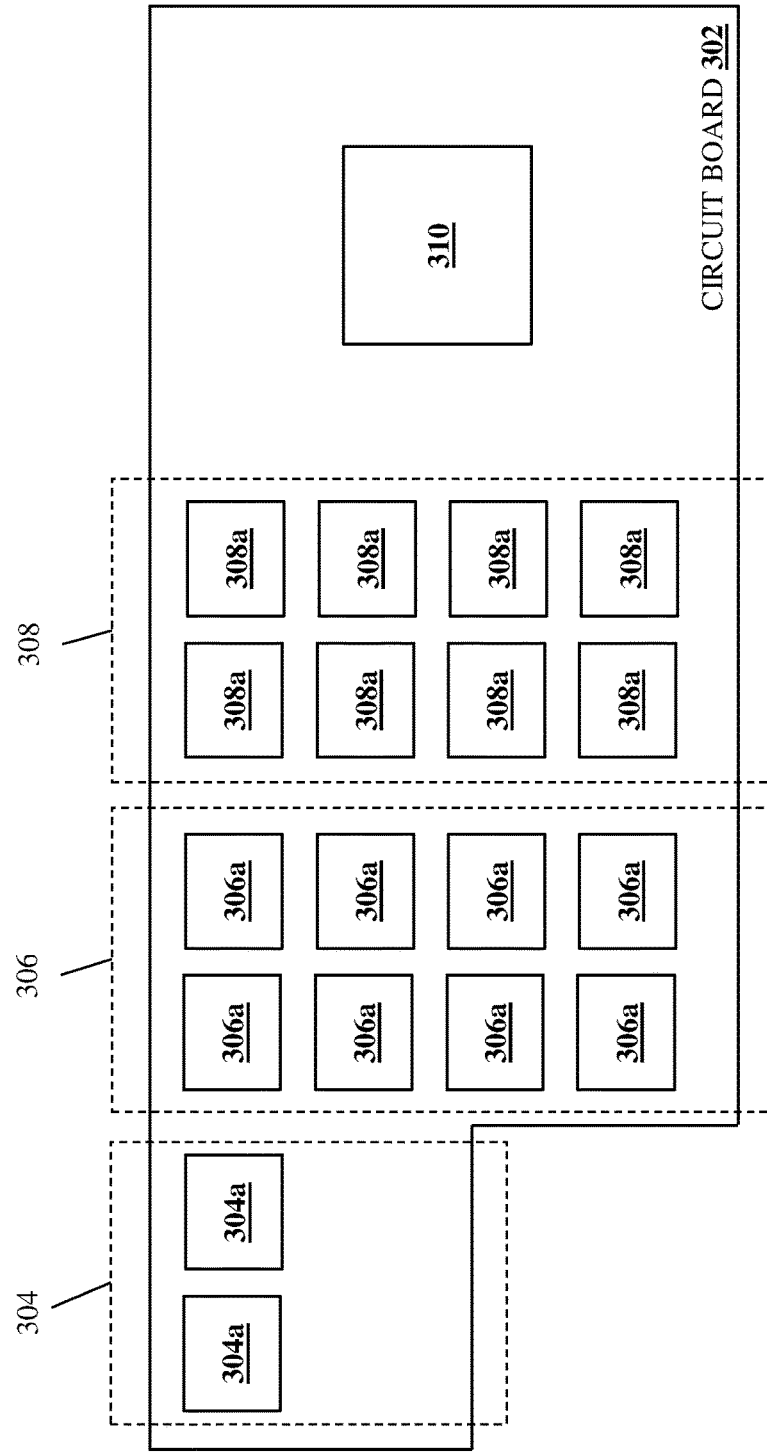
FIG. 3 is a schematic view illustrating an embodiment of a test device.

Referring now to FIG. 3, an embodiment of a test device 300 is illustrated that may tested using the multi-zone temperature testing device of the present disclosure. As will be appreciated by one of skill in the art in possession of the present disclosure, the testing device 300 may be configured for use by the IHS 100 discussed above with reference to FIG. 1, and in the specific examples discussed below is provided by a NAND storage subsystem that may be included in a storage device (e.g., the storage device 108) that may be used to store data in the IHS 100. However, while illustrated and discussed as being provided by a specific component in a storage device, one of skill in the art in possession of the present disclosure will recognize that test devices tested using the multi-zone temperature testing device of the present disclosure may include any devices and/or components that would be apparent to one of skill in the art in possession of the present disclosure. In the illustrated embodiment, the test device 300 includes a chassis that is provided by a circuit board 302 that supports the components in the test device 300, only some of which are illustrated and discussed below. However, one of skill in the art in possession of the present disclosure will appreciate how the chassis of the test device 300 may be provided in other manners while remaining within the scope of the present disclosure as well. Furthermore, in the illustrated embodiment, the circuit board 302 includes a plurality of components in different zones on the circuit board 302, with a first zone 304 including a first components 304a, a second zone 306 including second components 306a, and a third zone 308 including third components 308a.

In the specific examples provided herein, the first components 304a, the second components 306a, and the third components 308a are provided by NAND storage devices, with the different zones 304, 306, and 308 on the circuit board 302 have different thermal characteristics. For example, the first zone 304 is included on a portion of the circuit board 302 that has dimensions that are different than the rest of the circuit board 302 and includes only two NAND storage devices/first components 304a, the second zone 306 is located immediately adjacent the first zone 304 and includes six NAND storage devices/second components 306a, and the third zone 308 is located immediately adjacent the second zone 306, includes six NAND storage devices/third components 308a, and is also located immediately adjacent a portion of the circuit board 302 that extends from the third zone 308 and includes a Field Programmable Gate Array (FPGA) component 310 or other device controller known in the art.

As will be appreciated by one of skill in the art in possession of the present disclosure, the first zone 304 may have the different thermal characteristics discussed above relative to the second zone 306 and third zone 308 due to, for example, the relatively lower number of NAND storage devices/first components 304a, the relatively smaller dimensions of the circuit board area in the first zone 304, the relatively less dense configuration of the NAND storage devices/first components 304a on the circuit board 302 in the first zone 304, and/or based on any other thermal characteristic factors that would be apparent to one of skill in the art in possession of the present disclosure. Similarly, the second zone 306 may have the different thermal characteristics discussed above relative to the first zone 304 due to, for example, the relatively higher number of NAND storage devices/second components 306a, the relatively denser configuration of the NAND storage devices/second components 306a on the circuit board 302, and/or based on any other thermal characteristic factors that would be apparent to one of skill in the art in possession of the present disclosure. Similarly as well, the third zone 308 may have the different thermal characteristics discussed above relative to the first zone 304 due to, for example, the relatively higher number of NAND storage devices/third components 308a, the relatively denser configuration of the NAND storage devices/third components 308a on the circuit board 302, and/or based on any other thermal characteristic factors that would be apparent to one of skill in the art in possession of the present disclosure. Similarly as well, the third zone 308 may have the different thermal characteristics discussed above relative to the second zone 306 due to, for example, the portion of the circuit board 302 adjacent the third zone 308 (i.e., the portion of the circuit board 302 that includes the FPGA component 310) operating as a cooling fin, and one of skill in the art in possession of the present disclosure will appreciate how the thermal characteristics of the third zone 308 may differ depending on the operation (and level of operation) of the FPGA component 310 and any corresponding heat generation.

However, while a specific test device including a particular chassis (e.g., the circuit board 302) having particular components (e.g., NAND storage devices) in different zones with particular different thermal characteristics has been described, one of skill in the art in possession of the present disclosure will recognize how the multi-zone temperature testing device of the present disclosure may be utilized with test devices having a variety of different types of chassis, a variety of different types of components (including different components on the chassis rather than all the same components as with the NAND devices provided in the example herein) having any of a variety of different thermal characteristics for any of a variety of different reasons. As such, while the different thermal characteristics of components on the testing device are described as resulting from particular factors and being confined to particular zones one the testing device, the multi-zone temperature testing device of the present disclosure is envisioned as providing the benefits described below for any component configuration of any components with different thermal characteristics while remaining within the scope of the present disclosure as well.

Figure 4:
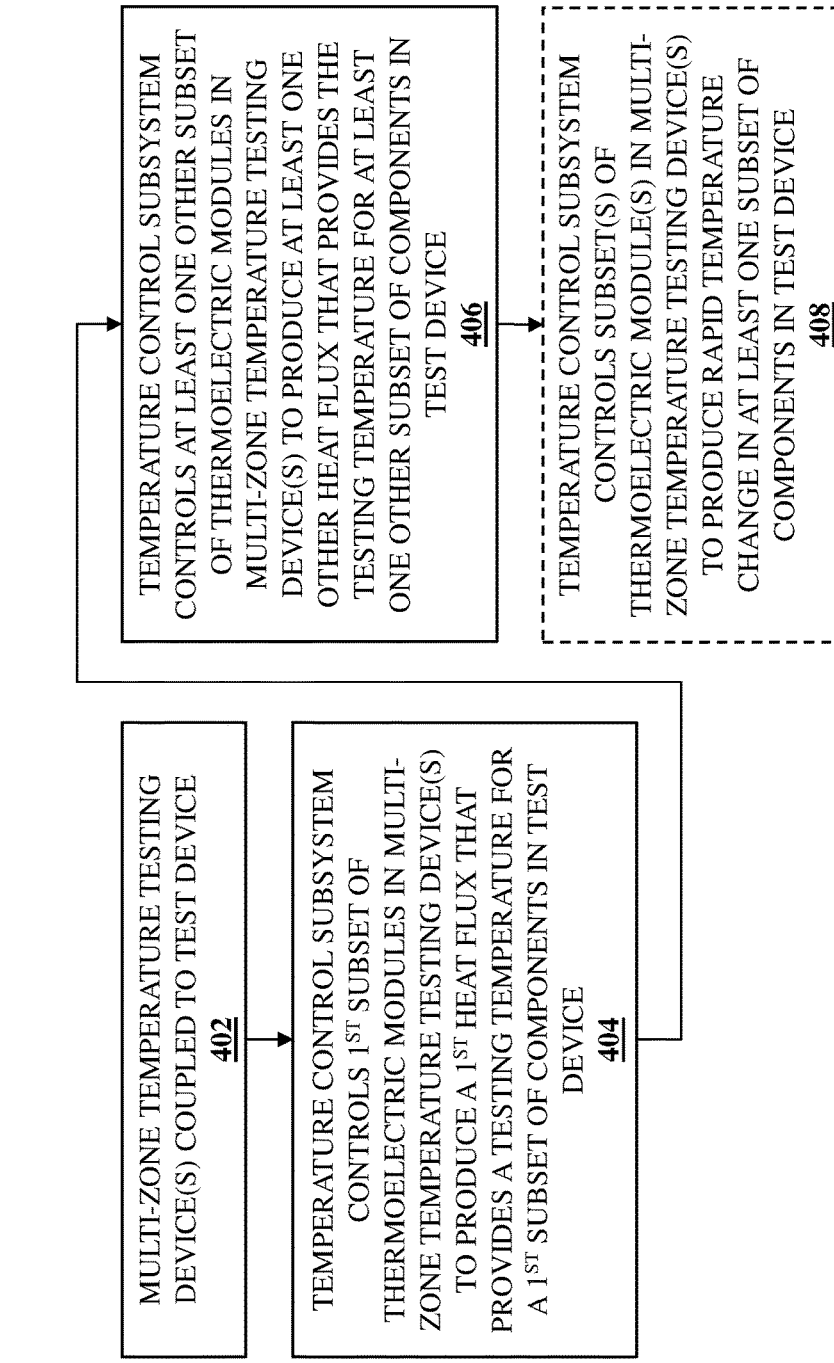
FIG. 4 is a flow chart illustrating an embodiment of a method for temperature testing a device.

Referring now to FIG. 4, an embodiment of a method 400 for temperature testing a device is illustrated. As discussed below, the systems and methods of the present disclosure provide for the production of different heat fluxes for different components on a test device that are associated with different thermal characteristics via the control of different thermoelectric modules in a testing device that is coupled to the test device in order to provide the different components on the testing device at a uniform temperature for testing. For example, the multi-zone temperature testing system of the present disclosure may include a test device having a plurality of components, a multi-zone temperature testing device that is coupled to the test device and that includes a first thermoelectric module that is located adjacent a first subset of the plurality of components and a second thermoelectric module that is located adjacent a second subset of the plurality of components, and a temperature control subsystem that is coupled to the multi-zone temperature testing device. The temperature control subsystem controls the first thermoelectric module in the multi-zone temperature testing device to produce a first heat flux that provides a testing temperature for the first subset of the plurality of components, and controls the second thermoelectric module in the multi-zone temperature testing device to produce a second heat flux that is different than the first heat flux and that provides the testing temperature for the second subset of the plurality of components. As will be appreciated by one of skill in the art in possession of the present disclosure, multi-zone temperature testing devices provided according to the teachings of the present disclosure allow for relatively large-scale device temperature testing, precise thermal control during temperature testing, and other benefits discussed below without the cost and complexity associated with conventional temperature testing systems.

Figure 5A:
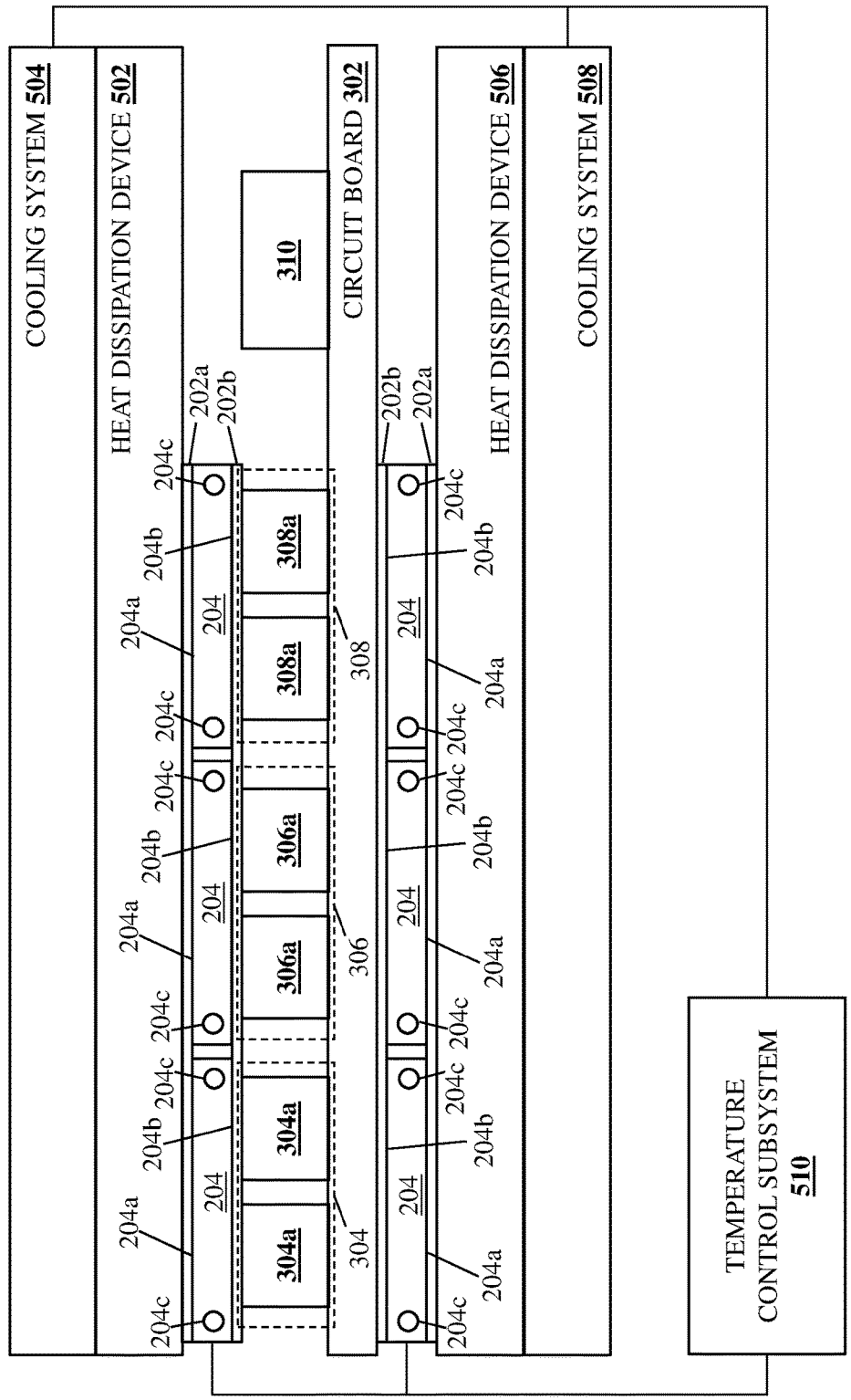
FIG. 5A is a schematic view illustrating an embodiment of the test device of FIG. 3 provided in a temperature testing system including the multi-zone temperature testing device of FIGS. 2A and 2B.

The method 400 begins at block 402 where one or more multi-zone temperature testing devices are coupled to a test device. With reference to FIG. 5A, in an embodiment of block 402, one or more of the multi-zone temperature testing devices 200 discussed above with reference to FIGS. 2A and 2B may be coupled to the test device 300 discussed above with reference to FIG. 3. In the specific example discussed below, a multi-zone temperature testing system 500 is provided that utilizes the multi-zone temperature testing device 200 of the present disclosure. In the illustrated embodiment, the test device 300 including the first components 304a, the second components 306a, and third components 308a on the circuit board 302 may be positioned between a pair of the multi-zone temperature testing device 200 discussed above with reference to FIGS. 2A and 2B such that a first of the multi-zone temperature testing devices 200 engages each of the first components 304a, the second components 306a, and third components 308a on the circuit board 302, and a second of the multi-zone temperature testing devices 200 engages the circuit board 302 (e.g., a "bottom" surface of the circuit board 302) opposite the circuit board 302 from the first components 304a, the second components 306a, and third components 308a.

As will be appreciated by one of skill in the art in possession of the present disclosure, the use of the two multi-zone temperature testing devices 200 on opposite sides of the components being temperature tested may provide for relatively faster and more uniform temperature control during that temperature testing. However, embodiments in which only a single multi-zone temperature testing device 200 (or more than two multi-zone temperature testing devices 200) are utilized to perform temperature testing are envisioned as falling within the scope of the present disclosure as well.

As can be seen FIG. 5A, the orientation of the second of the multi-zone temperature testing devices 200 is reversed relative to the orientation of the first of the multi-zone temperature testing devices 200 such that the bottom wall 202b of the chassis 202 on the first of the multi-zone temperature testing devices 200 engages each of the first components 304a, the second components 306a, and third components 308a, while the top wall 202a of the chassis 202 on the second of the multi-zone temperature testing devices 200 engages the circuit board 302 (i.e., the multi-zone temperature testing devices 200 engage the "top" and "bottom" of the first components 304a, the second components 306a, and third components 308a on the circuit board). However, one of skill in the art in possession of the present disclosure will appreciate how orientations of the multi-zone temperature testing device 200 that are different than those illustrated in FIG. 5A will fall within the scope of the present disclosure as well.

As can be seen in the embodiment illustrated in FIG. 5A, a pair of thermoelectric modules 204 in the first of the multi-zone temperature testing devices 200 and a pair of thermoelectric modules 204 in the second of the multi-zone temperature testing devices 200 are located on opposite sides of the first zone 304 that includes the first components 304a, a pair of thermoelectric modules 204 in the first of the multi-zone temperature testing devices 200 and a pair of thermoelectric modules 204 in the second of the multi-zone temperature testing devices 200 are located on opposite sides of the second zone 306 that includes the second components 306a, and a pair of thermoelectric modules 204 in the first of the multi-zone temperature testing devices 200 and a pair of thermoelectric modules 204 in the second of the multi-zone temperature testing devices 200 are located on opposite sides of the third zone 308 that includes the third components 308a. However, while a specific configuration of the multi-zone temperature testing devices 200 and the test device 300 in the multi-zone temperature testing system 500 is illustrated in FIG. 5A, one of skill in the art in possession of the present disclosure will appreciate how the multi-zone temperature testing system 500 and/or the multi-zone temperature testing devices 200 may be configured differently depending on the configuration, components, thermal characteristics, and/or other factors associated with the temperature testing and/or the test device being temperature tested.

In the illustrated embodiment, a heat dissipation device 502 is coupled to the first of the multi-zone temperature testing devices 200 discussed above. For example, the heat dissipation device 502 may be provided by heat pipes, heat spreaders, heat sinks, and/or other heat dissipation devices known in the art, and may engage the top wall 202a of the chassis 202 on the first of the multi-zone temperature testing devices 200 via, for example, a thermal paste or other heat transfer material and/or coupling known in the art. Furthermore, a cooling system 504 is coupled to the heat dissipation device 502, and may be provided by fan devices, liquid cooling systems, and/or other cooling systems that would be apparent to one of skill in the art in possession of the present disclosure. Similarly, a heat dissipation device 506 is coupled to the second of the multi-zone temperature testing devices 200 discussed above. For example, the heat dissipation device 506 may be provided by heat pipes, heat spreaders, heat sinks, and/or other heat dissipation devices known in the art, and may engage the top wall 202a of the chassis 202 on the second of the multi-zone temperature testing devices 200 via, for example, a thermal paste or other heat transfer material and/or coupling known in the art. Furthermore, a cooling system 508 is coupled to the heat dissipation device 506, and may be provided by fan devices, liquid cooling systems, and/or other cooling systems that would be apparent to one of skill in the art in possession of the present disclosure. While not illustrated, one of skill in the art in possession of the present disclosure will appreciate how the cooling system 508 may be positioned on a chassis, stand-offs, or other support structure to ensure sufficient airflow to the cooling system 508.

As will be appreciated by one of skill in the art in possession of the present disclosure, the heat dissipation devices 502 and 506 and the cooling systems 504 and 508 may provide the ability to produce larger heat fluxes in the thermoelectric modules 204 by assisting in the transfer of heat on one side of those thermoelectric modules 204. However, multi-zone temperature testing systems without one or more of the heat dissipation devices and/or cooling systems are envisioned as falling within the scope of the present disclosure as well.

In the illustrated embodiment, a temperature control subsystem 510 is coupled to each of the multi-zone temperature testing devices 200 and each of the cooling systems 504 and 508. In an embodiment, the temperature control subsystem 510 may be provided by the IHS 100 discussed above with reference to FIG. 1, and/or may include some or all of the components of the IHS 100. In a specific example, the temperature control subsystem 510 may be included in a desktop computing device, a laptop/notebook computing device, a tablet computing device, a mobile phone, and/or any other computing device that would be apparent to one of skill in the art in possession of the present disclosure. In a specific example, the temperature control subsystem 510 is included in a temperature testing control computing device that is utilized to perform the temperature testing on the test device 200, although embodiments in which the temperature control subsystem 510 is coupled to the temperature testing control computing device that is utilized to perform the temperature testing on the test device 200 will fall within the scope of the present disclosure as well. In a specific example, the temperature control subsystem 510 may utilize Pulse Width Modulation (PWM) techniques to control the thermoelectric modules 204 as discussed below and may include a Proportional Integrate Derivative (PID) controller that performs control loops based on the temperatures provided for the components on the test device 300. As such, one of skill in the art in possession of the present disclosure will appreciate how the multi-zone temperature testing devices 200 and cooling systems 504 may be controlled as described below in a variety of manners that will fall within the scope of the present disclosure.

Figure 5B:
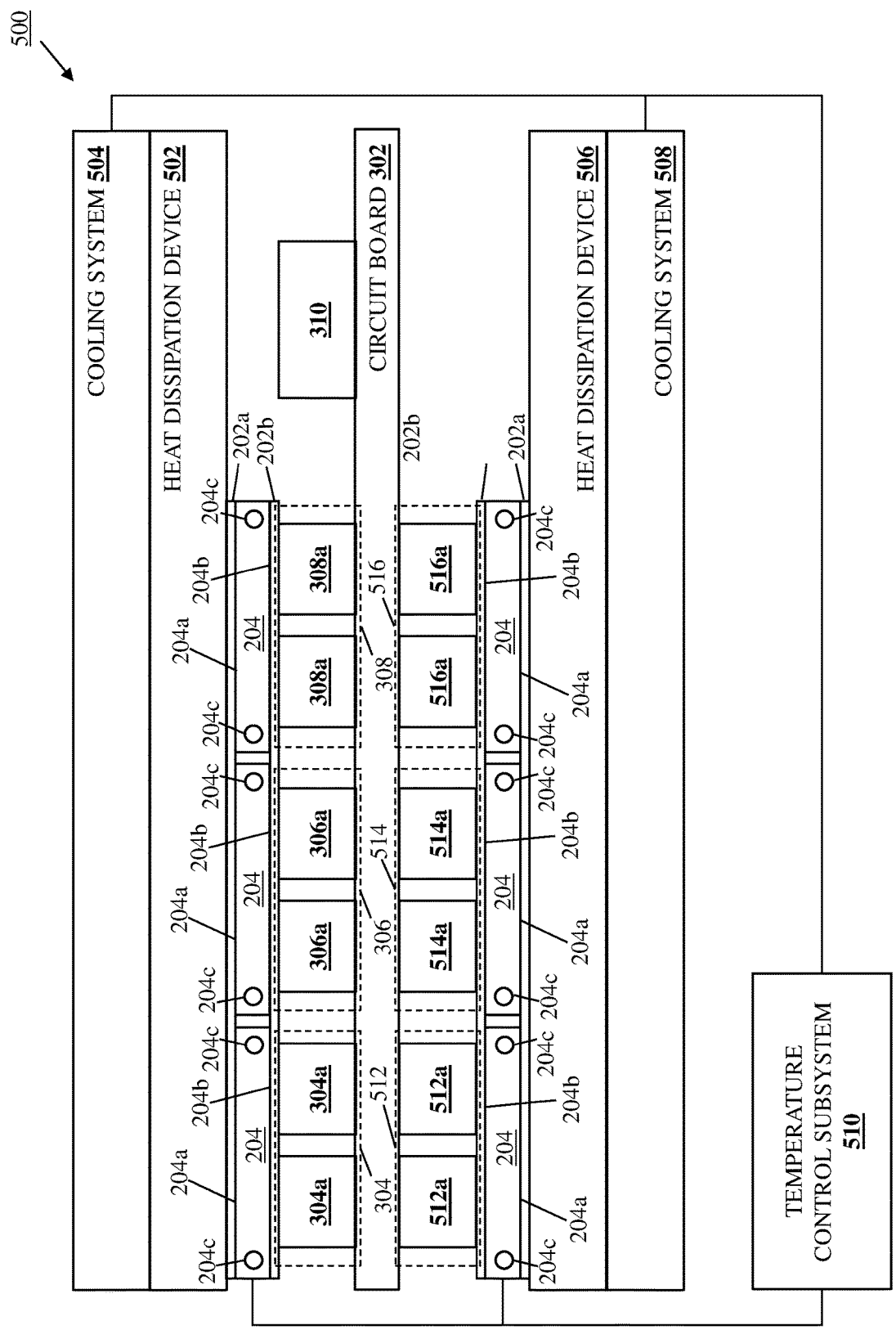
FIG. 5B is a schematic view illustrating an alternate embodiment of a modification of the test device of FIG. 3 provided in a temperature testing system including the multi-zone temperature testing device of FIGS. 2A and 2B.

As discussed above, the multi-zone temperature testing system 500 and/or the test device 300 may vary in configuration based on a variety of factors. For example, FIG. 5B illustrates an embodiment of the test device 300 that also includes a fourth zone 512 including fourth components 512a located opposite the circuit board 302 from the first components 304a in the first zone 304, a fifth zone 514 including fifth components 514a located opposite the circuit board 302 from the second components 306a in the second zone 306, and a sixth zone 516 including sixth components 514a located opposite the circuit board 302 from the third components 308a in the third zone 308. Furthermore, as can be seen in FIG. 5B, the top wall 202a of the chassis 202 on the second of the multi-zone temperature testing devices 200 engages each of the fourth components 512a, the fifth components 514a, and sixth components 516a, with a thermoelectric module 204 in the second of the multi-zone temperature testing devices 200 located adjacent the fourth zone 512 that includes the fourth components 512a, a thermoelectric module 204 in the second of the multi-zone temperature testing devices 200 located adjacent the fifth zone 514 that includes the fifth components 514a, and a thermoelectric module 204 in the second of the multi-zone temperature testing devices 200 located adjacent the sixth zone 516 that includes the sixth components 516a. As such, while the method 400 is described below as being performed on the test device of FIG. 3 using the multi-zone temperature testing system 500 of FIG. 5A, one of skill in the art in possession of the present disclosure will appreciate how different configurations of the multi-zone temperature testing system 500 and/or test device 300 (like that illustrated in FIG. 5B) may operate similarly as discussed below while remaining within the scope of the present disclosure.

Figure 6A:
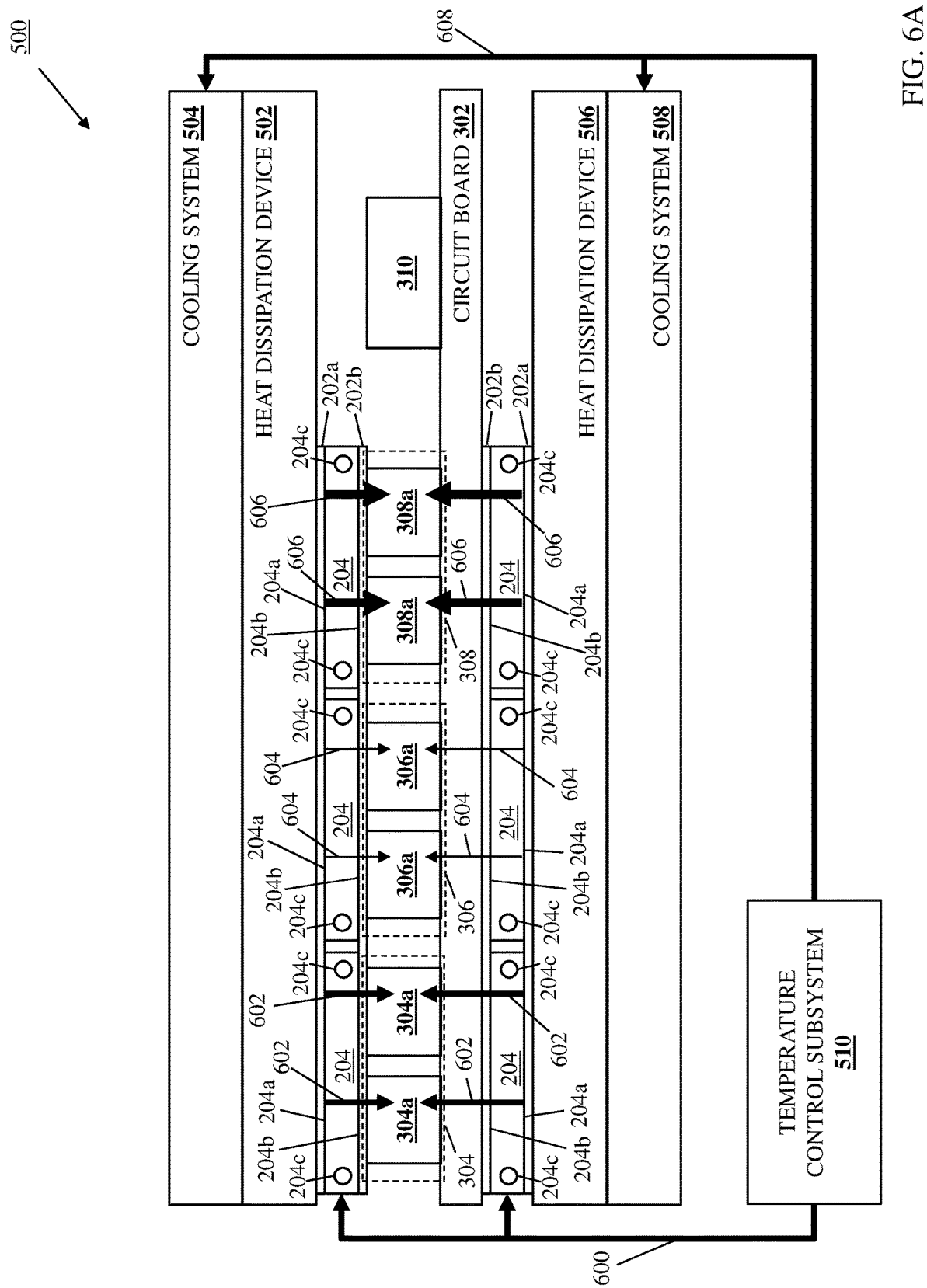
FIG. 6A is a schematic view illustrating an embodiment of the test device of FIG. 3 being tested by the temperature testing system of FIG. 5A during the method of FIG. 4.

The method 400 then proceeds to block 404 where a temperature control subsystem controls a first subset of thermoelectric modules in the multi-zone temperature testing device(s) to produce a first heat flux that provides a testing temperature for a first subset of components in the test device. With reference to FIG. 6A, in an embodiment of block 404, the temperature control subsystem 510 may perform temperature control operations 600 that include controlling the thermoelectric modules 204 in the first and second multi-zone temperature testing devices 200 that are located on opposite sides of the first zone 304 and the first components 304a to produce a first heat flux that provides a testing temperature for the first components 304a. For example, the temperature testing for the first components 304a on the test device 300 may require an elevated temperature for some period of time, and the temperature testing control computing device that is performing the temperature testing on the test device 200 may provide instructions to the temperature control subsystem 510 that are configured to raise the temperature of those first components 304a to that elevated temperature.

In an embodiment and as discussed above, at block 404 and in response to receiving the instruction from the temperature testing control computing device as discussed above, the temperature control subsystem 510 may cause a voltage to be applied to the power couplings 204c on the thermoelectric modules 204 in the first and second multi-zone temperature testing devices 200 that are located on opposite sides of the first zone 304, which in the embodiment illustrated in FIG. 6A results in a current in those thermoelectric modules 204 that produces a heat flux 602 in each of those thermoelectric modules 204 towards the first components 304a. As will be appreciated by one of skill in the art in possession of the present disclosure in the art in possession of the present disclosure, the voltage provided to produce the heat flux 602 may be based on the thermal characteristics of the first zone 304 of the circuit board 302 that includes those first components 304a, and thus may be selected to produce a testing temperature in the first components 304a that is desired/required by the temperature test being performed on the test device 300. In the examples discussed below, the heat flux 602 produced at block 404 is a relatively intermediate heat flux (as illustrated by the intermediate weight arrow elements 602 relative to the other heat fluxes produced by the multi-zone temperature testing devices 200 discussed in further detail below) that may be required to produce the testing temperature for the first components 304a due to the thermal characteristics of the first zone 304 (e.g., due to the first zone 304 including fewer components that the second zone 306 and third zone 308, and a portion of the circuit board 302 that operates to help cool the first components 304a).

As such, one of skill in the art in possession of the present disclosure in the art in possession of the present disclosure will appreciate how the first components 304a, the first zone 304 of the circuit board 302, and/or the circuit board 302 may be characterized (e.g., via modeling, experimentation, and/or other techniques that would be apparent to one of skill in the art in possession of the present disclosure in the art in possession of the present disclosure) by a user of the multi-zone temperature testing system 500 in order to identify different temperatures that are produced in the first components 304a via different heat fluxes generated by the thermoelectric modules 204 in the first and second multi-zone temperature testing devices 200 that are located on opposite sides of the first zone 304 so that, for any desired testing temperature, the corresponding heat flux required to produce that testing temperature in the first components 304a may be identified and produced by the thermoelectric modules 204 in the first and second multi-zone temperature testing devices 200 that are located on opposite sides of the first zone 304. However, while a specific example of the generation of heat fluxes to produce a testing temperature for components in a test device has been described, one of skill in the art in possession of the present disclosure in the art in possession of the present disclosure will appreciate how the thermoelectric modules 204 in the testing device 200 may be controlled to generate heat flux(es) that produce a testing temperature for component(s) in a variety of manners that will fall within the scope of the present disclosure as well.

The method 400 then proceeds to block 406 where the temperature control subsystem controls at least one other subset of thermoelectric modules in the multi-zone temperature testing device(s) to produce at least one other heat flux that provides the testing temperature for at least one other subset of components in the test device. As will be appreciated by one of skill in the art in possession of the present disclosure in the art in possession of the present disclosure, while illustrated as separate blocks of the method 400, blocks 404 and 406 may be performed at the same time or in a different order than illustrated in FIG. 4 while remaining within the scope of the present disclosure. For example, with continued reference to FIG. 6A and in an embodiment of block 406, the temperature control operations 600 performed by the temperature control subsystem 510 may include controlling the thermoelectric modules 204 in the first and second multi-zone temperature testing devices 200 that are located on opposite sides of the second zone 306 and the second components 306a to produce a second heat flux that provides the testing temperature for the second components 306a. Continuing with the example provided above, the temperature testing for the second components 306a on the test device 300 may require an elevated temperature for some period of time, and the temperature testing control computing device that is performing the temperature testing on the test device 200 may provide instructions to the temperature control subsystem 510 that are configured to raise the temperature of those second components 306a to that elevated temperature.

Similarly as discussed above, at block 406 and in response to receiving the instruction from the temperature testing control computing device as discussed above, the temperature control subsystem 510 may cause a voltage to be applied to the power couplings 204c on the thermoelectric modules 204 in the first and second multi-zone temperature testing devices 200 that are located on opposite sides of the second zone 306, which in the embodiment illustrated in FIG. 6A results in a current in those thermoelectric modules 204 that produces a heat flux 604 in each of those thermoelectric modules 204 towards the second components 306a. As will be appreciated by one of skill in the art in possession of the present disclosure in the art in possession of the present disclosure, the voltage provided to produce the heat flux 604 may be based on the thermal characteristics of the second zone 306 of the circuit board 302 that includes those second components 306a, and thus may be selected to produce a testing temperature in the second components 306a that is desired/required by the temperature test being performed on the test device 300. In the examples discussed below, the heat flux 604 produced at block 406 is a relatively low heat flux (as illustrated by the low weight arrow elements 604 relative to the other heat fluxes produced by the multi-zone temperature testing devices 200 discussed above and in further detail below) that may be required to produce the testing temperature for the second components 306a due to the thermal characteristics of the second zone 306 (e.g., due to the second zone 306 including a relatively high number of components and relatively less surface area of the circuit board 302).

As such, one of skill in the art in possession of the present disclosure in the art in possession of the present disclosure will appreciate how the second components 306a, the second zone 306 of the circuit board 302, and/or the circuit board 302 may be characterized (e.g., via modeling, experimentation, and/or other techniques that would be apparent to one of skill in the art in possession of the present disclosure in the art in possession of the present disclosure) by a user of the multi-zone temperature testing system 500 in order to identify different temperatures that are produced in the second components 306a via different heat fluxes generated by the thermoelectric modules 204 in the first and second multi-zone temperature testing devices 200 that are located on opposite sides of the second zone 306 so that, for any desired testing temperature, the corresponding heat flux required to produce that testing temperature in the second components 306a may be identified and produced by the thermoelectric modules 204 in the first and second multi-zone temperature testing devices 200 that are located on opposite sides of the second zone 306. However, while a specific example of the generation of heat fluxes to produce a testing temperature for components in a test device has been described, one of skill in the art in possession of the present disclosure in the art in possession of the present disclosure will appreciate how the thermoelectric modules 204 in the testing device 200 may be controlled to generate heat flux(es) that produce a testing temperature for component(s) in a variety of manners that will fall within the scope of the present disclosure as well.

In another example, with continued reference to FIG. 6A and in an embodiment of block 406, the temperature control operations 600 performed by the temperature control subsystem 510 may include controlling the thermoelectric modules 204 in the first and second multi-zone temperature testing devices 200 that are located on opposite sides of the third zone 308 and the third components 308a to produce a third heat flux that provides the testing temperature for the third components 308a. Continuing with the example provided above, the temperature testing for the third components 308a on the test device 300 may require an elevated temperature for some period of time, and the temperature testing control computing device that is performing the temperature testing on the test device 200 may provide instructions to the temperature control subsystem 510 that are configured to raise the temperature of those third components 308a to that elevated temperature.

Similarly as discussed above, at block 406 and in response to receiving the instruction from the temperature testing control computing device as discussed above, the temperature control subsystem 510 may cause a voltage to be applied to the power couplings 204c on the thermoelectric modules 204 in the first and second multi-zone temperature testing devices 200 that are located on opposite sides of the third zone 308, which in the embodiment illustrated in FIG. 6A results in a current in those thermoelectric modules 204 that produces a heat flux 606 in each of those thermoelectric modules 204 towards the third components 308a. As will be appreciated by one of skill in the art in possession of the present disclosure in the art in possession of the present disclosure, the voltage provided to produce the heat flux 606 may be based on the thermal characteristics of the third zone 308 of the circuit board 302 that includes those third components 308a, and thus may be selected to produce a testing temperature in the third components 308a that is desired/required by the temperature test being performed on the test device 300. In the examples discussed below, the heat flux 606 produced at block 406 is a relatively high heat flux (as illustrated by the high weight arrow elements 606 relative to the other heat fluxes produced by the multi-zone temperature testing devices 200 discussed above) that may be required to produce the testing temperature for the third components 308a due to the thermal characteristics of the third zone 308 (e.g., due to the third zone 308 being located immediately adjacent a relatively large surface area of the circuit board 302 that operates to help cool the third components 308a, particularly when the FPGA component 310 is not operating).

As such, one of skill in the art in possession of the present disclosure in the art in possession of the present disclosure will appreciate how the third components 308a, the third zone 308 of the circuit board 302, and/or the circuit board 302 may be characterized (e.g., via modeling, experimentation, and/or other techniques that would be apparent to one of skill in the art in possession of the present disclosure in the art in possession of the present disclosure) by a user of the multi-zone temperature testing system 500 in order to identify different temperatures that are produced in the third components 308a via different heat fluxes generated by the thermoelectric modules 204 in the first and second multi-zone temperature testing devices 200 that are located on opposite sides of the third zone 308 so that, for any desired testing temperature, the corresponding heat flux required to produce that testing temperature in the third components 308a may be identified and produced by the thermoelectric modules 204 in the first and second multi-zone temperature testing devices 200 that are located on opposite sides of the third zone 308. However, while a specific example of the generation of heat fluxes to produce a testing temperature for components in a test device has been described, one of skill in the art in possession of the present disclosure in the art in possession of the present disclosure will appreciate how the thermoelectric modules 204 in the testing device 200 may be controlled to generate heat flux(es) that produce a testing temperature for component(s) in a variety of manners that will fall within the scope of the present disclosure as well.

With continued reference to FIG. 6A, in an embodiment of blocks 404 and/or 406, the temperature control subsystem 510 may perform cooling system activation operations 608 that include activating the cooling systems 504 and/or 508 in order to transfer heat from the multi-zone temperature testing devices 200 and assist in the generation of the heat fluxes 602, 604, and/or 606. As discussed above and as will be appreciated by one of skill in the art in possession of the present disclosure, the heat dissipation device 502 is configured to dissipate heat from the multi-zone temperature testing device 200 that engages it, while the operation of the cooling system 504 will increase the dissipation of the heat from the heat dissipation device 502, and thus the activation of the cooling system 504 may allow any of the thermoelectric modules 204 in the multi-zone temperature testing device 200 that engages the heat dissipation device 502 to produce the heat fluxes 602, 604, and/or 606 (e.g., by providing a "boost" to the heat flux).

Similarly, the heat dissipation device 506 is configured to dissipate heat from the multi-zone temperature testing device 200 that engages it, while the operation of the cooling system 508 will increase the dissipation of the heat from the heat dissipation device 506, and thus the activation of the cooling system 508 may allow any of the thermoelectric modules 204 in the multi-zone temperature testing device 200 that engages the heat dissipation device 506 to produce the heat fluxes 602, 604, and/or 606 (e.g., by providing a "boost" to the heat flux). Furthermore, while the cooling systems 504 and 508 are described as being activated to provide a "boost" to the heat flux provided by the multi-zone temperature testing devices 200, one of skill in the art in possession of the present disclosure will appreciate how the cooling systems 504 and 508 may already be operating when the heat flux is provided by the multi-zone temperature testing devices 200, and then may have their operation increased to provide the "boost" to that heat flux while remaining within the scope of the present disclosure as well.

As such, blocks 404 and 406 may be performed to generate different heat fluxes 602, 604, and 606 to the first components 304a, the second components 306a, and the third components 308a, respectively, in the first zone 304, the second zone 306, and the third zone 308, respectively, in order to provide a testing temperature for each of the first components 304a, the second components 306a, and the third components 308a. To provide a specific example, the testing temperature may be 85 C, and thus the heat fluxes 602, 604, and 606 may be generated to provide each of the first components 304a, the second components 306a, and the third components 308a at 85 C. However, while the multi-zone temperature testing devices 200 are described as producing different heat fluxes to provide a common/uniform elevated temperature for each of the first components 304a, the second components 306a, and the third components 308a, one of skill in the art in possession of the present disclosure will appreciate how the multi-zone temperature testing device 200 may be utilized to provide different components on a test device 300 at different temperatures while remaining within the scope of the present disclosure as well.

Figure 6B:
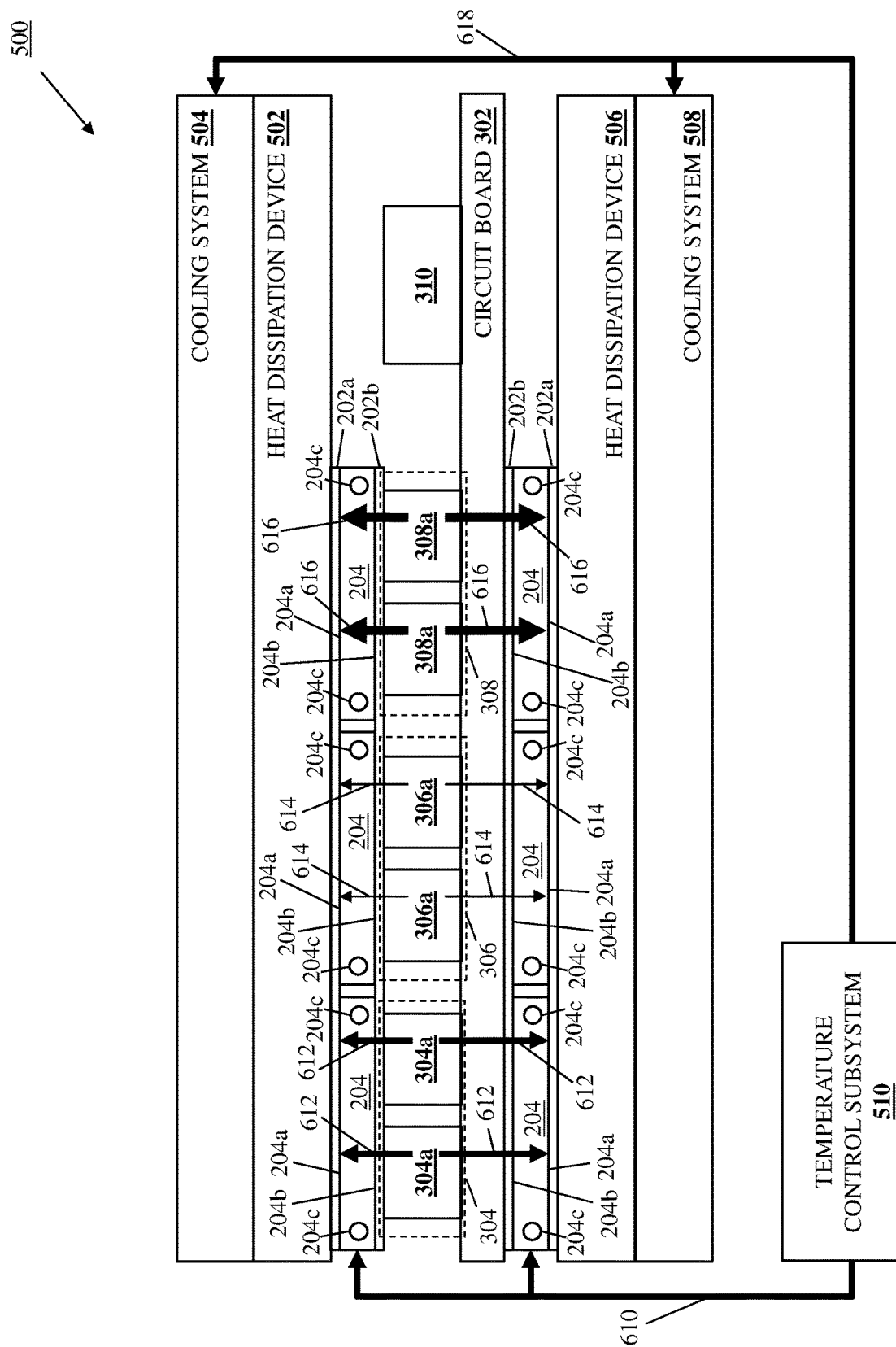
FIG. 6B is a schematic view illustrating an embodiment of the test device of FIG. 3 being tested by the temperature testing system of FIG. 5A during the method of FIG. 4.

With reference to FIG. 6B, in another embodiment of block 404, the temperature control subsystem 510 may perform temperature control operations 610 that include controlling the thermoelectric modules 204 in the first and second multi-zone temperature testing devices 200 that are located on opposite sides of the first zone 304 and the first components 304a to produce a first heat flux that provides a testing temperature for the first components 304a. For example, the temperature testing for the first components 304a on the test device 300 may require a reduced temperature for some period of time, and the temperature testing control computing device that is performing the temperature testing on the test device 200 may provide instructions to the temperature control subsystem 510 that are configured to reduce the temperature of those first components 304a to that reduced temperature.

In an embodiment and as discussed above, at block 404 and in response to receiving the instruction from the temperature testing control computing device as discussed above, the temperature control subsystem 510 may cause a voltage to be applied to the power couplings 204c on the thermoelectric modules 204 in the first and second multi-zone temperature testing devices 200 that are located on opposite sides of the first zone 304, which in the embodiment illustrated in FIG. 6B results in a current in those thermoelectric modules 204 that produces a heat flux 612 in each of those thermoelectric modules 204 away from the first components 304a. In the examples discussed below, the heat flux 602 produced at block 404 is a relatively intermediate heat flux (as illustrated by the intermediate weight arrow elements 612 relative to the other heat fluxes produced by the multi-zone temperature testing devices 200 discussed in further detail below) that may be required to produce the testing temperature for the first components 304a due to the thermal characteristics of the first zone 304 (e.g., due to the first zone 304 including fewer components that the second zone 306 and third zone 308, and a portion of the circuit board 302 that operates to help cool the first components 304a).

The method 400 then proceeds to block 406 where the temperature control subsystem controls at least one other subset of thermoelectric modules in the multi-zone temperature testing device(s) to produce at least one other heat flux that provides the testing temperature for at least one other subset of components in the test device. With continued reference to FIG. 6B and in an embodiment of block 406, the temperature control operations 600 performed by the temperature control subsystem 510 may include controlling the thermoelectric modules 204 in the first and second multi-zone temperature testing devices 200 that are located on opposite sides of the second zone 306 and the second components 306a to produce a second heat flux that provides the testing temperature for the second components 306a. Continuing with the example provided above, the temperature testing for the second components 306a on the test device 300 may require a reduced temperature for some period of time, and the temperature testing control computing device that is performing the temperature testing on the test device 200 may provide instructions to the temperature control subsystem 510 that are configured to reduce the temperature of those second components 306a to that reduced temperature.

Similarly as discussed above, at block 406 and in response to receiving the instruction from the temperature testing control computing device as discussed above, the temperature control subsystem 510 may cause a voltage to be applied to the power couplings 204c on the thermoelectric modules 204 in the first and second multi-zone temperature testing devices 200 that are located on opposite sides of the second zone 306, which in the embodiment illustrated in FIG. 6B results in a current in those thermoelectric modules 204 that produces a heat flux 614 in each of those thermoelectric modules 204 away from the second components 306a. In the examples discussed below, the heat flux 604 produced at block 406 is a relatively low heat flux (as illustrated by the low weight arrow elements 604 relative to the other heat fluxes produced by the multi-zone temperature testing devices 200 discussed above and in further detail below) that may be required to produce the testing temperature for the second components 306a due to the thermal characteristics of the second zone 306 (e.g., due to the second zone 306 including a relatively high number of components and relatively less surface area of the circuit board 302).

In another example, with continued reference to FIG. 6B and in an embodiment of block 406, the temperature control operations 600 performed by the temperature control subsystem 510 may include controlling the thermoelectric modules 204 in the first and second multi-zone temperature testing devices 200 that are located on opposite sides of the third zone 308 and the third components 308a to produce a third heat flux that provides the testing temperature for the third components 308a. Continuing with the example provided above, the temperature testing for the third components 308a on the test device 300 may require a reduced temperature for some period of time, and the temperature testing control computing device that is performing the temperature testing on the test device 200 may provide instructions to the temperature control subsystem 510 that are configured to reduce the temperature of those third components 308a to that reduced temperature.

Similarly as discussed above, at block 406 and in response to receiving the instruction from the temperature testing control computing device as discussed above, the temperature control subsystem 510 may cause a voltage to be applied to the power couplings 204c on the thermoelectric modules 204 in the first and second multi-zone temperature testing devices 200 that are located on opposite sides of the third zone 308, which in the embodiment illustrated in FIG. 6B results in a current in those thermoelectric modules 204 that produces a heat flux 616 in each of those thermoelectric modules 204 away from the third components 308a. In the examples discussed below, the heat flux 616 produced at block 406 is a relatively high heat flux (as illustrated by the high weight arrow elements 606 relative to the other heat fluxes produced by the multi-zone temperature testing devices 200 discussed above) that may be required to produce the testing temperature for the third components 308a due to the thermal characteristics of the third zone 308 (e.g., due to the third zone 308 being located immediately adjacent a relatively large surface area of the circuit board 302 that operates to help cool the third components 308a).

As such, blocks 404 and 406 may be performed to generate different heat fluxes 612, 614, and 616 to the first components 304a, the second components 306a, and the third components 308a, respectively, in the first zone 304, the second zone 306, and the third zone 308, respectively, in order to provide a testing temperature for each of the first components 304a, the second components 306a, and the third components 308a. To provide a specific example, the testing temperature may be 20 C, and thus the heat fluxes 612, 614, and 616 may be provided to provide each of the first components 304a, the second components 306a, and the third components 308a at 20 C. However, while the multi-zone temperature testing devices 200 are described as producing different heat fluxes to provide a common/uniform reduced temperature for each of the first components 304a, the second components 306a, and the third components 308a, one of skill in the art in possession of the present disclosure will appreciate how the multi-zone temperature testing device 200 may be utilized to provide different components on a test device 300 at different temperatures while remaining within the scope of the present disclosure as well.

With continued reference to FIG. 6B, in an embodiment of blocks 404 and/or 406, the temperature control subsystem 510 may perform cooling system activation operations 618 that include activating the cooling systems 504 and/or 508 in order to transfer heat from the multi-zone temperature testing devices 200 and assist in the generation of the heat fluxes 612, 614, and/or 616. Similarly discussed above and as will be appreciated by one of skill in the art in possession of the present disclosure, the heat dissipation device 502 is configured to dissipate heat from the multi-zone temperature testing device 200 that engages it, while the operation of the cooling system 504 will increase the dissipation of the heat from the heat dissipation device 502, and thus the activation of the cooling system 502 may allow any of the thermoelectric modules 204 in the multi-zone temperature testing device 200 that engages the heat dissipation device 502 to produce the heat fluxes 612, 614, and/or 616. Similarly, the heat dissipation device 506 is configured to dissipate heat from the multi-zone temperature testing device 200 that engages it, while the operation of the cooling system 508 will increase the dissipation of the heat from the heat dissipation device 506, and thus the activation of the cooling system 508 may allow any of the thermoelectric modules 204 in the multi-zone temperature testing device 200 that engages the heat dissipation device 506 to produce the heat fluxes 612, 614, and/or 616.

As will be appreciated by one of skill in the art in possession of the present disclosure, while the examples discussed above with reference to FIGS. 6A and 6B illustrate and describe providing the same direction of heat flux (e.g., either heating or cooling) each of the first components 304a, the second components 306a, and the third components 308a, the multi-zone temperature testing devices 200 may be operated to provide different directions of heat flux to the first components 304a, the second components 306a, and/or the third components 308a (i.e., to heat some of the first components 304a, the second components 306a, and/or the third components 308a, and cool the others of the first components 304a, the second components 306a, and/or the third components 308a).

The method 400 may then proceed to optional block 408 where the temperature control subsystem controls subset(s) of thermoelectric module(s) in the multi-zone temperature testing device(s) to produce a rapid temperature change in at least one subset of components in the test device. In an embodiment, at block 408, the temperature testing of the test device 300 may require a rapid temperature change for any of the first components 304a, the second components 306a, and/or the third components 308a. For example, the temperature testing may call for elevating the temperature of NAND storage devices that provide any of the first components 304a, the second components 306a, and/or the third components 308a to 85 C in order to perform program/write operations on those NAND storage devices at that elevated temperature, and then rapidly decreasing the temperature of those NAND storage devices to 20 C, which one of skill in the art in possession of the present disclosure will appreciate will allow the programming/writing of data to the NAND storage devices to be tested, while attempting to minimize the data aging effects associated with maintaining the elevated temperature of the NAND storage devices for any extended period of time.

Figure 7:
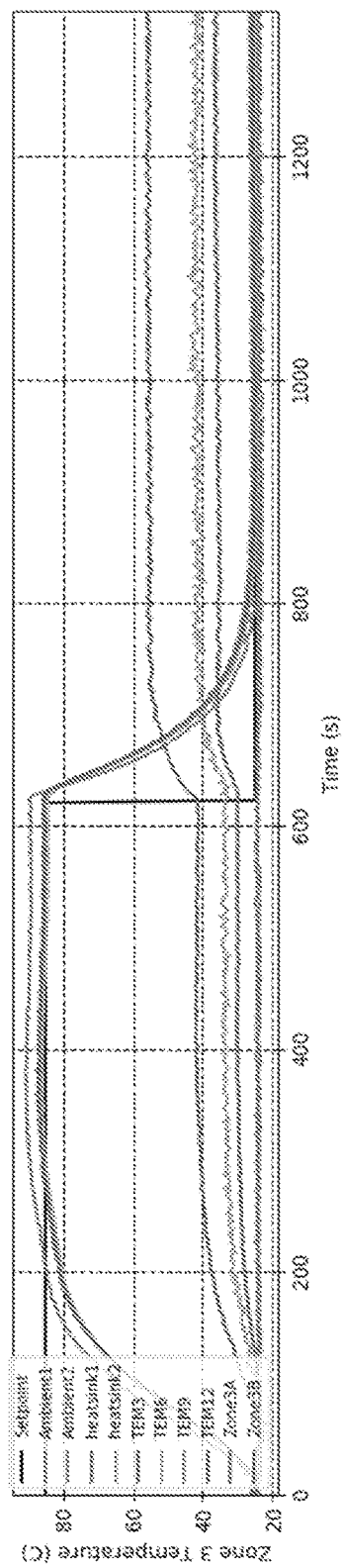
FIG. 7 is a graph view illustrating an embodiment of testing results from the testing of the test device of FIG. 3 by the temperature testing system of FIG. 5A during the method of FIG. 4.
Figure 8:
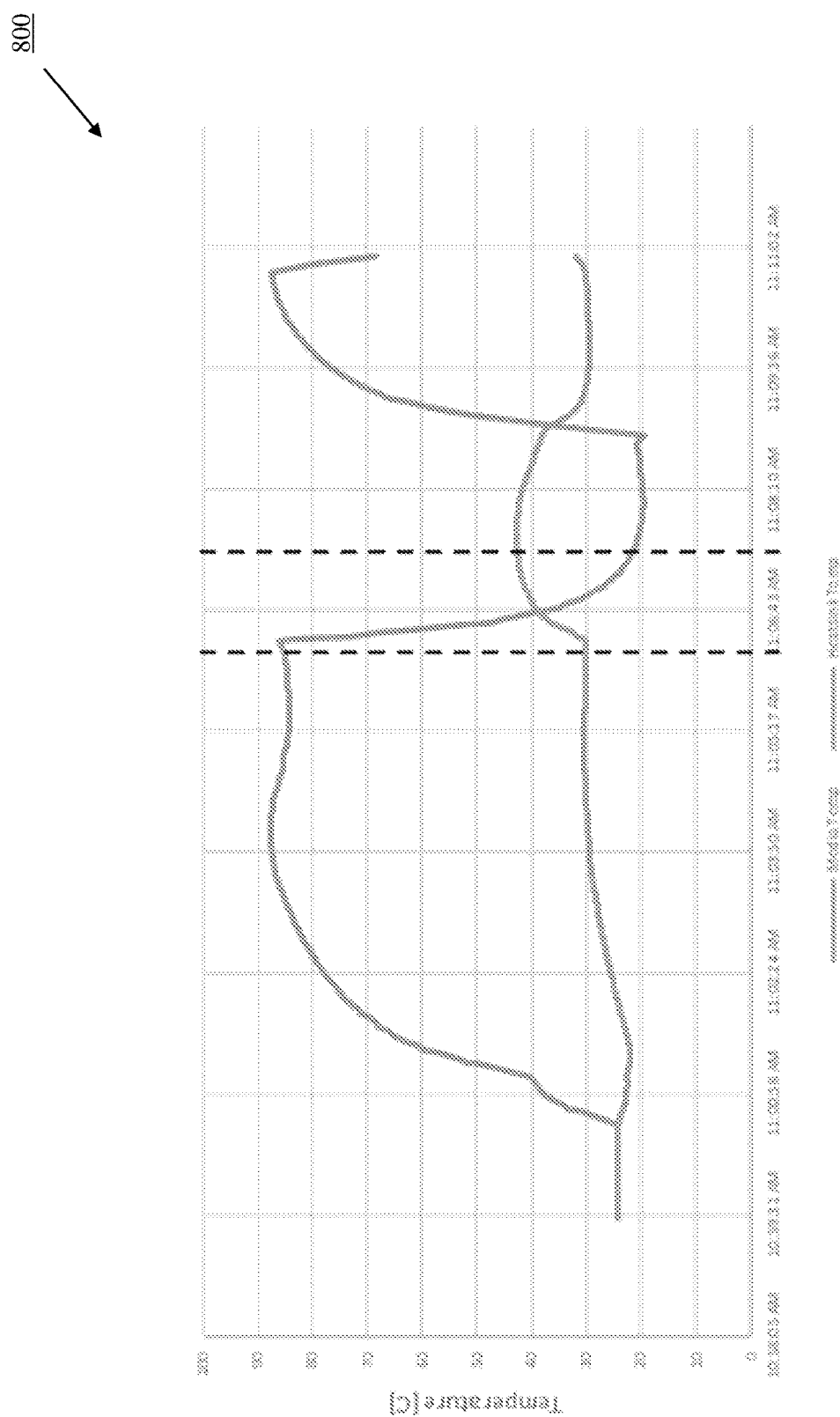
FIG. 8 is a graph view illustrating an embodiment of testing result from the testing of the test device of FIG. 3 by the temperature testing system of FIG. 5A during the method of FIG. 4

As such, optional block 408 may include providing the first components 304a, the second components 306a, and/or the third components 308a at the elevated temperature similarly as illustrated and discussed with reference to FIG. 6A, writing data to the first components 304a, the second components 306a, and/or the third components 308a, and then immediately reducing the temperature of the first components 304a, the second components 306a, and/or the third components 308a similarly as illustrated and discussed with reference to FIG. 6B. In experimental embodiments of the multi-zone temperature testing devices of the present disclosure, relatively rapid temperature changes in test devices were observed. For example, with reference to FIG. 7, and experimental embodiment 700 was performed in which the test device was elevated to a temperature of approximately 85 C and, at approximately 620 seconds into the testing, a rapid temperature reduction was performed in which the temperature of the test device was reduced to approximately 25 C at approximately 800 seconds into the testing, thus providing an approximately 60 C reduction in temperature over approximately 180 seconds after which a steady state temperature was achieved. In another example, with reference to FIG. 8, an experimental embodiment 800 was performed in which the test device was rapidly elevated from a temperature of approximately 25 C to a temperature of approximately 90 C over approximately 200 seconds, followed by a rapid temperature reduction in which the temperature of the test device was reduced to approximately 20 C over approximately 60 seconds, and then followed by another rapid temperature elevation up to approximately 85 C over approximately 60 seconds.

Furthermore, the inventors of the present disclosure have discovered that the thermoelectric modules utilized in the multi-zone temperature testing devices of the present disclosure provide particular temperature change advantages when the voltage to a thermoelectric module is reversed (e.g., to switch the operation of the thermoelectric module from transferring heat to a test device to transferring heat from a test device). For example, the cooling power Q c of a thermoelectric module is governed by the following equation:

$$Qc = (S*Tc*I) - (\tfrac{1}{2}*I^2*R) - (K*\Delta T)$$

Where S is the Seebeck coefficient and is a function of the density of states of materials in the thermoelectric module, Tc is the cold temperature of the thermoelectric module, I is the current produced in the thermoelectric module, R is the resistance of the thermoelectric module, K is thermal conductance of the thermoelectric module, and $\Delta T$ is the difference between the hot temperature and the cold temperature of the thermoelectric module. As such, as $\Delta T$ increases, the amount of heat pumped through the thermoelectric module reduces.

However, the inventors of the present disclosure have discovered that, in a relatively short duration following a reversal of the voltage polarity to the power couplings of the thermoelectric module, $\Delta T$ becomes a negative value, and until the hot temperature and the cold temperature of the thermoelectric module reverse as well, the opposite temperature bias operates to increase the amount of heat pumped through the thermoelectric module, thus "boosting" the rapid temperature changes provided at optional block 408.

Thus, systems and methods have been described that provide for the production of different heat fluxes for different components on a test device that are associated with different thermal characteristics via the control of different thermoelectric modules in a testing device that is coupled to the test device in order to provide the different components on the testing device at a uniform temperature for testing. For example, the multi-zone temperature testing system of the present disclosure may include a test device having a plurality of components, a multi-zone temperature testing device that is coupled to the test device and that includes a first thermoelectric module that is located adjacent a first subset of the plurality of components and a second thermoelectric module that is located adjacent a second subset of the plurality of components, and a temperature control subsystem that is coupled to the multi-zone temperature testing device. The temperature control subsystem controls the first thermoelectric module in the multi-zone temperature testing device to produce a first heat flux that provides a testing temperature for the first subset of the plurality of components, and controls the second thermoelectric module in the multi-zone temperature testing device to produce a second heat flux that is different than the first heat flux and that provides the testing temperature for the second subset of the plurality of components. As will be appreciated by one of skill in the art in possession of the present disclosure, multi-zone temperature testing devices provided according to the teachings of the present disclosure allow for relatively large-scale device temperature testing, precise thermal control during temperature testing, and other benefits discussed below without the cost and complexity associated with conventional temperature testing systems.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A multi-zone temperature testing system, comprising:
a test device having a plurality of components and including a first side and a second side that is located opposite the test device from the first side;
a first multi-zone temperature testing device that is coupled to the first side of the test device and that includes a first thermoelectric module that is located adjacent a first subset of the plurality of components and a second thermoelectric module that is located adjacent a second subset of the plurality of components;
a second multi-zone temperature testing device that is coupled to the second side of the test device and that includes a third thermoelectric module that is located adjacent the first subset of the plurality of components and a fourth thermoelectric module that is located adjacent a second subset of the plurality of components; and
a temperature control subsystem that is coupled to the first multi-zone temperature testing device and the second multi-zone temperature testing device and that is configured to:
control the first thermoelectric module in the first multi-zone temperature testing device to produce a first heat flux and control the third thermoelectric module in the second multi-zone temperature testing device to produce a third heat flux, wherein the first heat flux and the third heat flux provide a first testing temperature for the first subset of the plurality of components; and
control the second thermoelectric module in the first multi-zone temperature testing device to produce a second heat flux and control the fourth thermoelectric module in the second multi-zone temperature testing device to produce a fourth heat flux, wherein the second heat flux and the fourth heat flux provides a second testing temperature for the second subset of the plurality of components that is different than the first testing temperature.

2. The system of claim 1, wherein the plurality of components include NAND storage devicess.

3. The system of claim 1, wherein the providing the first testing temperature for the first subset of the plurality of components and the second testing temperature for the second subset of the plurality of components includes increasing the temperature for the first subset of the plurality of components and the second subset of the plurality of components.

4. The system of claim 1, wherein the providing the first testing temperature for the first subset of the plurality of components and the second testing temperature for the second subset of the plurality of components includes decreasing the temperature for the first subset of the plurality of components and the second subset of the plurality of components.

5. The system of claim 1, wherein the first thermoelectric module and the second thermoelectric module are modular components that have been coupled together to provide a first multi-zone temperature testing device configuration for the first multi-zone temperature testing device that corresponds to a test device configuration of the test device, and wherein the third thermoelectric module and the fourth thermoelectric module are modular components that have been coupled together to provide second multi-zone temperature testing device configuration for the second multi-zone temperature testing device that corresponds to the test device configuration of the test device.

6. The system of claim 1, further comprising:
a fifth thermoelectric module that is included on the first multi-zone temperature testing device and that is located adjacent a third subset of the plurality of components, and a sixth thermoelectric module that is included on the second multi-zone temperature testing device and that is located adjacent the third subset of the plurality of components, wherein the temperature control subsystem is configured to:
control the fifth thermoelectric module in the first multi-zone temperature testing device to produce a fifth heat flux, and control the sixth thermoelectric module in the second multi-zone temperature testing device to produce a sixth heat flux, wherein the fifth heat flux and the sixth heat flux provides a third testing temperature for the third subset of the plurality of components that is different than the first testing temperature and the second testing temperature.

7. The system of claim 1, further comprising:
a cooling system that is coupled to the first multi-zone temperature testing device, wherein the temperature control subsystem is configured to:
control the cooling system to transfer heat from the first thermoelectric module to produce the first heat flux, and to transfer heat from the second thermoelectric module to produce the second heat flux.

8. A multi-zone temperature testing system, comprising:
a first multi-zone temperature testing device that includes:
a first thermoelectric module that is configured to:
be located adjacent a first subset of a plurality of components on a test device when the first multi-zone temperature testing device chassis-is coupled to a first side of the test device; and
produce a first heat flux; and
a second thermoelectric module that is included in the chassis and that is configured to:
be located adjacent a second subset of a the plurality of components on the test device when the first multi-zone temperature testing device is coupled to the first side of the test device; and
produce a second heat flux; and
a second multi-zone temperature testing device that includes:
a third thermoelectric module that is configured to:
be located adjacent the first subset of the plurality of components on the test device when the second multi-zone temperature testing device is coupled to a second side of the test device that is opposite the test device from the first side; and
produce a third heat flux, wherein the first heat flux and the third heat flux provide a first testing temperature for the first subset of the plurality of components; and
a fourth thermoelectric module that is configured to:
be located adjacent the second subset of the plurality of components on the test device when the second multi-zone temperature testing device is coupled to the second side of the test device; and produce a fourth heat flux, wherein the second heat flux and the fourth heat flux provide a second testing temperature for the second subset of the plurality of components that is different than the first testing temperature.

9. The system of claim 8, wherein the providing the first testing temperature for the first subset of the plurality of components and the second testing temperature for the second subset of the plurality of components includes increasing the temperature for the first subset of the plurality of components and the second subset of the plurality of components.

10. The system of claim 8, wherein the providing the first testing temperature for the first subset of the plurality of components and the second testing temperature for the second subset of the plurality of components includes decreasing the temperature for the first subset of the plurality of components and the second subset of the plurality of components.

11. The system of claim 8, further comprising:
a fifth thermoelectric module that is included in the first multi-zone temperature testing device and that is configured to:
be located adjacent a third subset of a plurality of components on the test device when the first multi-zone temperature testing device is coupled to the first side of the test device; and
produce a fifth heat flux; and
a sixth thermoelectric module that is included in the second multi-zone temperature testing device and that is configured to:
be located adjacent the third subset of a plurality of components on the test device when the second multi-zone temperature testing device is coupled to the second side of the test device; and
produce a sixth heat flux, wherein the fifth heat flux and the sixth heat flux provide a third testing temperature for the third subset of the plurality of components that is different than the first testing temperature and the second testing temperature.

12. The system of claim 8, wherein the first thermoelectric module and the second thermoelectric module are modular components that have been coupled together to provide a first multi-zone temperature testing device configuration that corresponds to a test device configuration of the test device, and wherein the third thermoelectric module and the fourth thermoelectric module are modular components that have been coupled together to provide second multi-zone temperature testing device configuration for the second multi-zone temperature testing device that corresponds to the test device configuration of the test device.

13. The system of claim 8, wherein the first multi-zone temperature testing device is configured to be coupled to a cooling system and to transfer heat to the cooling system to allow the first thermoelectric module to produce the first heat flux and to allow the second thermoelectric module to produce the second heat flux.

14. A method for multi-zone temperature testing a device, comprising:
coupling, by a first multi-zone temperature testing device, to a first side of a test device such that a first thermoelectric module in the first multi-zone temperature testing device is located adjacent a first subset of a plurality of components on the test device, and a second thermoelectric module in the first multi-zone temperature testing device is located adjacent a second subset of the plurality of components on the test device;
coupling, by a second multi-zone temperature testing device, to a second side of a test device that is opposite the test device from the first side such that a third thermoelectric module in the second multi-zone temperature testing device is located adjacent the first subset of a plurality of components on the test device, and a fourth thermoelectric module in the second multi-zone temperature testing device is located adjacent the second subset of the plurality of components on the test device;
producing, by the first thermoelectric module in the first multi-zone temperature testing device, a first heat flux; and
producing, by the second thermoelectric module in the first multi-zone temperature testing device, a second heat flux;
producing, by the third thermoelectric module in the second multi-zone temperature testing device, a third heat flux, wherein the first heat flux and the third heat flux provide a first testing temperature for the first subset of the plurality of components; and
producing, by the fourth thermoelectric module in the second multi-zone temperature testing device, a fourth heat flux, wherein the second heat flux and the fourth heat flux provide a second testing temperature for the second subset of the plurality of components that is different than the first testing temperature.

15. The method of claim 14, wherein the plurality of components include NAND storage devices.

16. The method of claim 14, wherein the providing the first testing temperature for the first subset of the plurality of components and the second testing temperature for the second subset of the plurality of components includes increasing the temperature for the first subset of the plurality of components and the second subset of the plurality of components.

17. The method of claim 14, wherein the providing the first testing temperature for the first subset of the plurality of components and the second testing temperature for the second subset of the plurality of components includes decreasing the temperature for the first subset of the plurality of components and the second subset of the plurality of components.

18. The method of claim 14, further comprising:
configuring, by the first thermoelectric module and the second thermoelectric module that are provided by respective modular components that are configured to be coupled together, the first multi-zone temperature testing device in a first multi-zone temperature testing device configuration that corresponds to a test device configuration of the test device; and
configuring, by the third thermoelectric module and the fourth thermoelectric module that are provided by respective modular components that are configured to be coupled together, the second multi-zone temperature testing device in a second multi-zone temperature testing device configuration that corresponds to the test device configuration of the test device.

19. The method of claim 14, further comprising:
coupling, by the first multi-zone temperature testing device, to the first side of the test device such that a fifth thermoelectric module is located adjacent a third subset of a plurality of components on the test device;
coupling, by the second multi-zone temperature testing device, to the second side of the test device such that a sixth thermoelectric module is located adjacent the third subset of a plurality of components on the test device;

producing, by the third thermoelectric module in the first multi-zone temperature testing device, a fifth heat flux; and producing, by the sixth thermoelectric module in the second multi-zone temperature testing device, a sixth heat flux, wherein the fifth heat flux and the sixth heat flux provide a third testing temperature for the third subset of the plurality of components that is different than the first testing temperature and the second testing temperature.

20. The method of claim 14, further comprising:

controlling, by a temperature control subsystem, a cooling system that is coupled to the first multi-zone temperature testing device to transfer heat from the first thermoelectric module to allow the first thermoelectric module to produce the first heat flux, and to transfer heat from the second thermoelectric module to allow the second thermoelectric module to produce the second heat flux.

\* \* \* \* \*

UNITED STATES PATENT AND TRADEMARK OFFICE
CERTIFICATE OF CORRECTION

PATENT NO. : 12,249,387 B2  
APPLICATION NO. : 17/897576  
DATED : March 11, 2025  
INVENTOR(S) : Proulx et al.

Page 1 of 1

It is certified that error appears in the above-identified patent and that said Letters Patent is hereby corrected as shown below:

In the Claims

Claim 1, Column 21, Line 45, "provides" should read --provide--

Claim 2, Column 21, Line 50, "devicess" should read --devices--

Claim 6, Column 22, Line 25, "provides" should read --provide--

Claim 8, Column 22, Line 43, delete "chassis-"

Claim 8, Column 22, Lines 46-47, should read as follows:  
--a second thermoelectric module that is configured to:--

Claim 8, Column 22, Line 48, "a the plurality" should read --the plurality--

Claim 14, Column 24, Line 15, delete "and"

Signed and Sealed this  
Sixth Day of May, 2025

Coke Morgan Stewart  
*Acting Director of the United States Patent and Trademark Office*